(12) United States Patent
Surdeanu et al.

(10) Patent No.: US 8,896,317 B2
(45) Date of Patent: Nov. 25, 2014

(54) LIGHTING UNIT WITH COMPENSATION FOR OUTPUT FREQUENCY, AND METHOD FOR DETERMINING OUTPUT FREQUENCY

(75) Inventors: Radu Surdeanu, Roosbeek (BE); Viet Nguyen Hoang, Leuven (BE); Benoit Bataillou, Brussels (BE); Pascal Bancken, Opwijk (BE); David Van Steenwinckel, Holsbeek (BE)

(73) Assignee: NXP B.V., Eindhoven (NL)

( * ) Notice: Subject to any disclaimer, the term of this patent is extended or adjusted under 35 U.S.C. 154(b) by 1137 days.

(21) Appl. No.: 12/867,218

(22) PCT Filed: Feb. 9, 2009

(86) PCT No.: PCT/IB2009/050531
§ 371 (c)(1),
(2), (4) Date: Aug. 11, 2010

(87) PCT Pub. No.: WO2009/101573
PCT Pub. Date: Aug. 20, 2009

(65) Prior Publication Data
US 2010/0308833 A1  Dec. 9, 2010

(30) Foreign Application Priority Data
Feb. 15, 2008  (EP) .................................... 08101668

(51) Int. Cl.
*G01R 31/02* (2006.01)
*H05B 33/08* (2006.01)

(52) U.S. Cl.
CPC ................................ *H05B 33/0866* (2013.01)
USPC ............................ 324/522; 324/519; 362/293

(58) Field of Classification Search
USPC ................. 324/403, 414, 521, 658, 519, 522; 362/293
See application file for complete search history.

(56) References Cited

U.S. PATENT DOCUMENTS

| 5,723,950 A | 3/1998 | Wei et al. | |
| 2004/0052076 A1* | 3/2004 | Mueller et al. | 362/293 |
| 2007/0228935 A1* | 10/2007 | Kim et al. | 313/503 |

FOREIGN PATENT DOCUMENTS

| WO | 2004032576 A1 | 4/2004 |
| WO | 2004112152 A2 | 12/2004 |
| WO | 2005098987 A2 | 10/2005 |
| WO | 2006/130973 A1 | 12/2006 |

OTHER PUBLICATIONS

International Search Report and Written Opinion for Application PCT/IB2009/050531 (Feb. 9, 2009).

* cited by examiner

*Primary Examiner* — Vincent Q Nguyen

(57) ABSTRACT

A method of determining the dominant output wavelength of an LED, includes determining an electrical characteristic of the LED which is dependent on the voltage-capacitance characteristics, and analyzing the characteristic to determine the dominant output wavelength.

19 Claims, 2 Drawing Sheets

Figure 1:
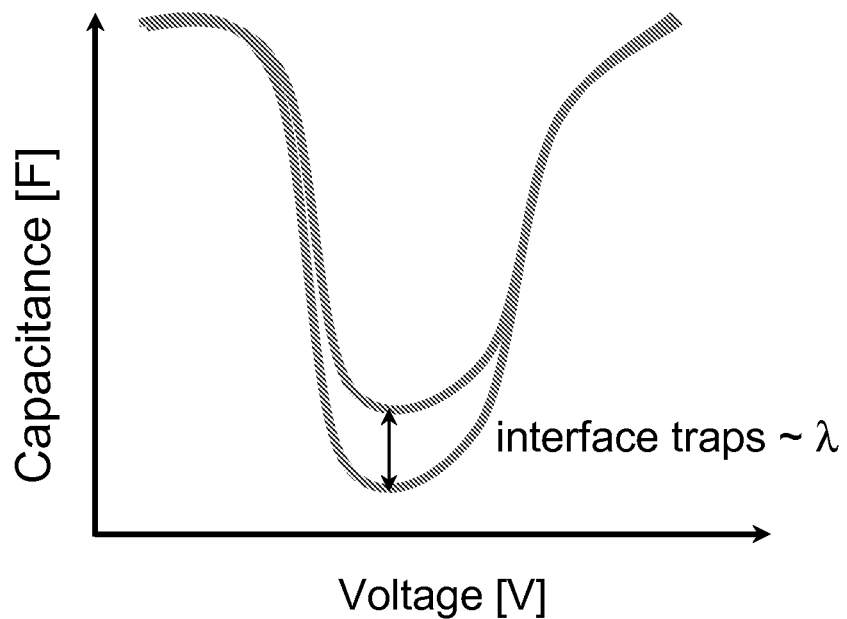

LIGHTING UNIT WITH COMPENSATION FOR OUTPUT FREQUENCY, AND METHOD FOR DETERMINING OUTPUT FREQUENCY

This invention relates to lighting devices using light emitting diodes (LEDs), and particularly to the control of such devices to compensate for variations in output frequency (i.e. colour).

Lighting using solid-state devices such as LEDs is gaining momentum. The use of LEDs for lighting has several advantages over the use of conventional light sources, including a better light output/dimension ratio and improved power efficiency.

It has been recognised that during operation, the LED temperature increases and this influences the amount of light output of the LED as well as the dominant wavelength of the output light.

It has been recognised that either temperature measurement or optical analysis of the light output is desirable to provide feedback value for use in controlling the LED driver conditions. This feedback can compensate both for temperature dependent effects and for ageing of the LED.

For temperature compensation, the LED temperature can be measured using an external temperature sensor located close to the LED or an integrated temperature sensor.

It has also been proposed to measure the light output flux and colour temperature, and use these measurements to provide a compensation drive scheme. This can compensate both for temperature effects and ageing. However, the measurement of colour temperature using an optical sensor requires complicated hardware and software.

A further source of non-uniformity in the output of LED devices arises during manufacture, because the LED is fabricated as a double heterostructure, where a lattice mismatch is always present between different layers. Due to this mismatch, defects are introduced in the structure, which results in the presence of interface states. Since the manufacturing process of the double heterostructure can never be perfectly controlled, LEDs from the same batch will have slight different density of interface traps, and as a result, slightly different wavelength.

This invention aims to enable the dominant wavelength of an LED to be determined in a simple manner, without the need for analysis of the optical output.

According to the invention, there is provided a method of determining the dominant output wavelength of an LED, comprising:
    determining an electrical characteristic of the LED which is dependent on the voltage-capacitance characteristics; and
    analysing the electrical characteristic to determine the dominant output wavelength.

This method enables the output wavelength to be determined using simple electrical analysis of the device characteristics. This enables variations between devices at manufacture to be compensated. For example, the analysis can comprise determining the phase, and deriving the dominant output wavelength from the phase. In one example, deriving the dominant output wavelength from the phase can comprise determining the phase difference from 90 degrees.

The dominant output wavelength can be determined by comparing the determined electrical characteristic with sample data which has been derived by analysing the relationship between the voltage-capacitance characteristic and the dominant output wavelength for sample LED devices. Thus, sample devices can be analysed optically in order to build a model of the device variations. This model then enables a simple wavelength determination based only the measured electrical characteristics, for example a phase measurement in the preferred example.

Information about the output intensity characteristics of the LED can also be determined from the electrical characteristic, if a suitable model has been created which relates the output wavelength to the intensity profile.

The invention also provides a method of controlling an LED, comprising:
    determining the dominant output wavelength using the method of the invention; and
    controlling the LED in dependence on the determined dominant output wavelength.

Thus, the control of the LED can be modified so that a desired output colour can be obtained despite variations between different LED devices.

The invention also provides a method of controlling a plurality of different coloured LEDs, comprising:
    determining the dominant output wavelength for each of the LEDs using the method of the invention; and
    controlling the LEDs in dependence on the determined dominant output wavelengths, thereby to obtain a desired combined colour output.

This control method can be used as part of a display driving method, wherein the plurality of different coloured LEDs define a display pixel, and wherein the display comprises a plurality of display pixels. Alternatively, the plurality of different coloured LEDs can define a display backlight.

The invention also provides an arrangement for determining the dominant output wavelength of an LED, comprising:
    means for determining an electrical characteristic of the LED which is dependent on the voltage-capacitance characteristics; and
    means for analysing the electrical characteristic to determine the dominant output wavelength.

The invention also provides a display device comprising:
    a plurality of LED pixels; and
    an arrangement of the invention for determining the dominant output wavelength of each LED.

Another display device of the invention comprises:
    a plurality of pixels;
    a backlight comprising a plurality of LEDs; and
    an arrangement of the invention for determining the dominant output wavelength of each LED.

Figure 2:
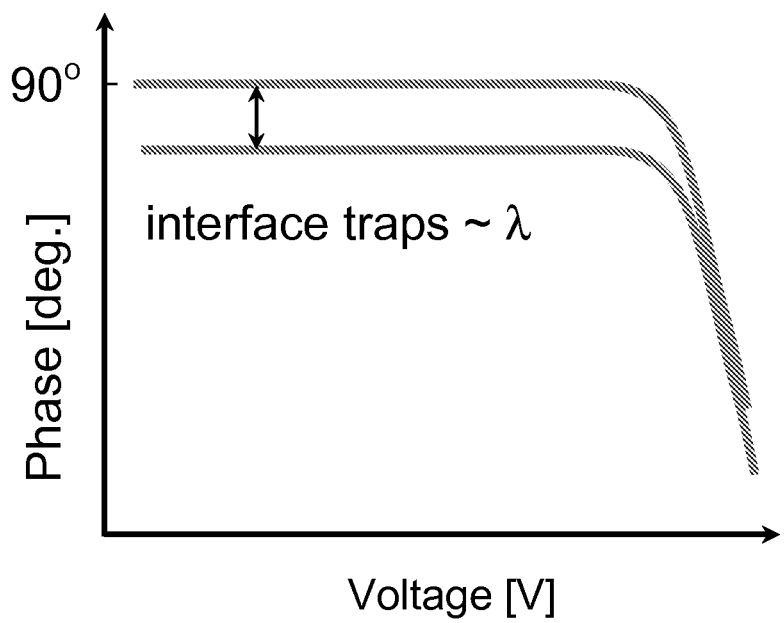
Figure 3:
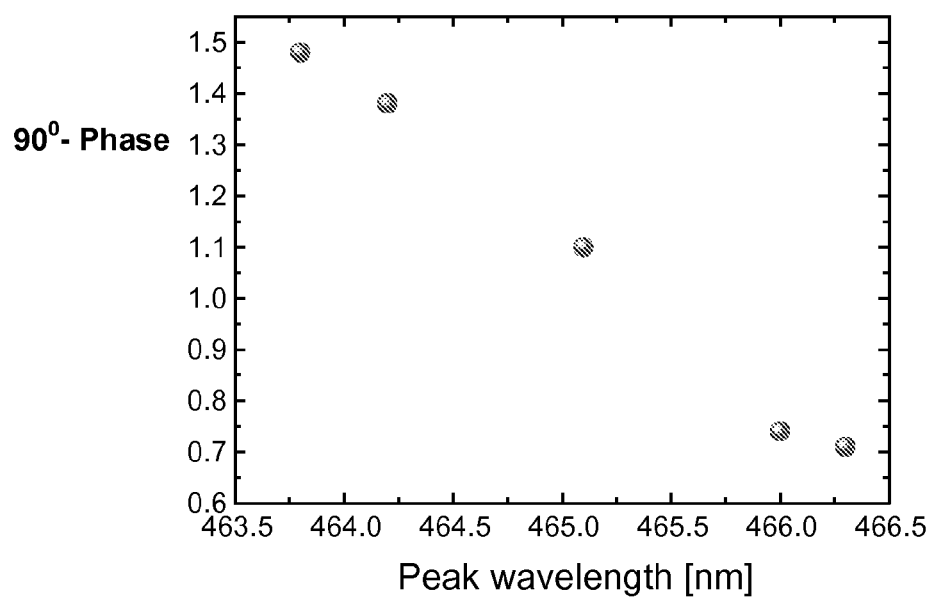
Figure 4:
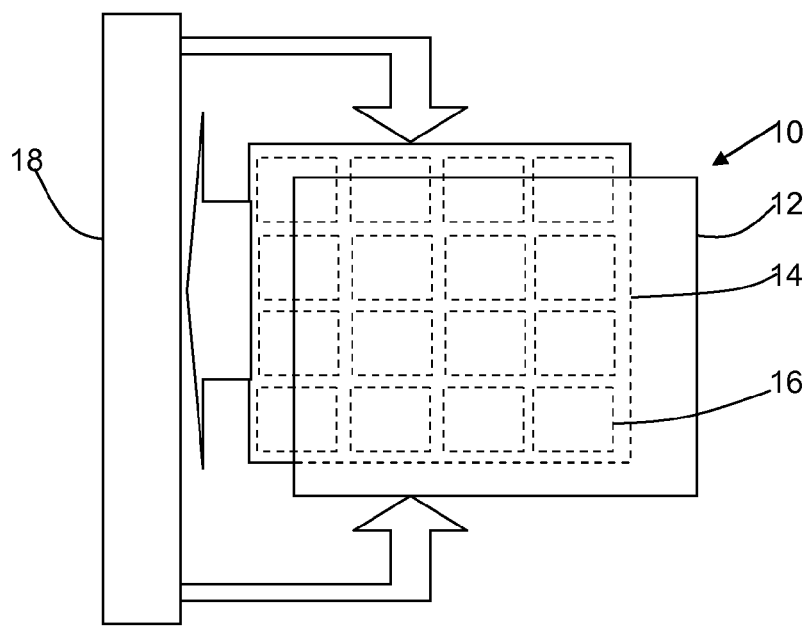

An example of the invention will now be described with reference to the accompanying drawings, in which:
    FIG. 1 is an example of voltage-capacitance characteristic for two different transistor gates;
    FIG. 2 shows the phase relationship of the two voltage capacitance characteristics of FIG. 1;
    FIG. 3 shows the relationship between phase and wavelength; and
    FIG. 4 shows an LED device and control circuit of the invention.

The invention provides a method for analysing the voltage-capacitance characteristic of an LED in order to determine the dominant output wavelength.

Capacitance-voltage measurements are routine measurements for analysing the characteristics of electronic devices, such as CMOS devices or p-n junctions.

FIG. 1 shows schematically two capacitance voltage measurements for two different p-n junctions.

The capacitance has a minima at a particular applied voltage. The difference in the capacitance value at this minima is related to the interface states present at the p-n junction interface.

In the case of an LED, the number of interface traps at the p-n junction dictates the output wavelength. Thus, a measurement which is dependent on the number of interface traps can be used as a parameter for determining the output wavelength of an LED.

An LED is fabricated as a double heterostructure, where a lattice mismatch is always present between different layers. Due to this mismatch, defects are introduced in the structure, which results in the presence of these interface states. Since the manufacturing process of the double heterostructure can never be perfectly controlled, LEDs from the same batch will have slight different density of interface traps, and as a result, slightly different wavelength.

By measuring the capacitance-voltage characteristics of the LED, the invention enables a measurement to be taken which is dependent on the density of the interface states, and thereby enables the wavelength variations between LEDs of the same batch to be determined.

The capacitance-voltage curve gives information concerning the conductance and the phase of the transfer function of the device under analysis. In particular, a model of the device characteristics can be used to extract the phase and conductance information from the C-V curve. The inventors have found that the influence of interface state variation is most easily seen in the phase analysis of the device characteristic.

FIG. 2 shows the phase relationship of the two voltage-capacitance characteristics of FIG. 1.

An ideal capacitor transfer function has a 90 degree phase. As shown in FIG. 2, the phase difference from 90° can be used as a measure which depends on the interface trap density and therefore can be used to determine the output wavelength.

By measuring the phase of a number of sample LED modules, and correlating these phase measurements with the output wavelength, a model can be created of the relationship between the phase measurements and the output wavelength. In a preferred implementation, this model can also determine the light output intensity characteristics.

In order to obtain this correlation model (which maps the electrical testing to wavelength and output intensity characteristics) by empirical sample testing, a number of sample measurements need to be taken:

phase measurements, which give the electrical indication of the density of interface traps.

spectrometer measurements that give the peak wavelength for the measured LED. For this, a simple conventional spectrometer is sufficient.

measurements taken using an integrating sphere, for determining the total light output of the LED.

A model is also created containing parameters related to the density of luminescent centers and non-radiative centers (traps). This gives an optical indication of how much light output an LED with a particular peak wavelength will give.

By calibrating this model-based light output value with the measured light output value determined by the integrating sphere, the correct values for luminescent centers and traps can be obtained. These values are then correlated to the electrical measurements to derive the relationship between electrical LED parameter (phase) and the wavelength and output intensity of the LED.

This model enables both the wavelength and intensity profile to be determined. A simpler model in accordance with the invention can be based simply on measurements of the phase and the output wavelength, to enable a simple one-to-one mapping to be derived.

The more complicated model can predict what changes take place in the band diagram, and therefore predict light output and wavelength changes as a function of LED current. This model can be based on the density of illumination centres and their position.

By deriving such a model based on sample testing, detailed mathematical modelling of the effect of the phase change on the output wavelength is not required.

As a result, it is possible to measure accurately the variations in wavelength by a simple phase measurement, at high enough frequencies, e.g. 1 MHz, such that the interface traps are clearly visible in the phase signal.

These measurements can be taken while the LED is in use. A high frequency enables the modulation of the LED output to be invisible, and it can be combined with the pulse width modulation operation of the LED.

The measurements can be taken during the life of the LED to enable the drive scheme to be corrected over time.

FIG. 3 is an example of a correlation graph, in which a phase measurement at 1 MHz is correlated with the peak wavelength of various blue LEDs. It can be clearly seen that this technique has a very high resolution in wavelength variations of the order of 0.5 nm.

The graph in FIG. 3 gives five sample results. The graph can then be converted to a function, for example a linear best fit function through the five plots, or a best fit quadratic or other function. This function can then be used to convert from a phase measurement to a wavelength value.

Alternatively, a look up table with discrete values of phase can be created from the samples to allow conversion from a phase measurement to a wavelength value.

The wavelength obtained can be used as a feedback parameter for use in a method of controlling the an LED. For example, a plurality of different coloured LEDs may together form a colour light output device. By determining the dominant output wavelength for each of the LEDs, they can then be controlled the LEDs in dependence on the determined dominant output wavelengths, thereby to obtain a desired combined colour output.

This approach may be used for example in a display driving method in which the plurality of different coloured LEDs define a display pixel, and wherein the display comprises a plurality of display pixels.

The approach of the invention can be used to monitor LED output wavelength and intensity characteristics over time, and thereby enable the drive scheme to correct for ageing as well as for differences between devices at manufacture. The is can be used to extend the lifetime of the LED.

The invention can be of particular interest for display applications using active backlight switching, in which the backlight is implemented as an arrangement of LEDs of the invention. This is an approach in which local areas of a backlight can be switched to different light output levels, for example to improve image contrast. In this type of system, fast switching on and off of LEDs takes place. This means that the wavelength of LEDs can shift. Knowing at a given time exactly the wavelength enables correction using an intelligent drive scheme.

Colour sequential LCD TVs are also being actively developed. In a colour sequential drive scheme, one red, one green and one blue image are formed (or combinations of these), and these are combined to generate the full colour image. Again, the colour of the LEDs needs to be known accurately to correctly construct the final image.

FIG. 4 shows an example LED device and control circuit of the invention.

The example of FIG. 4 comprises a display device 10 comprising an LCD display panel 12 and a segmented backlight 14 comprising LEDs 16. The display driver circuitry, schematically shown as 18, implements the phase measurement of the LEDs and controls the backlight 14 and the display panel 12 taking into account the determined LED wavelength and intensity characteristics.

The nature of the LED device has not been described in detail. This can be any type of conventional LED device. As will be clear from the description above, the LEDs can form display pixels or a display backlight. Numerous other applications will be apparent, such as for signage, billboards and other general colour light output devices. Specific colour outputs can be required for aesthetic as well as technical reasons, for example in museum settings.

The apparatus required for the C-V analysis of the samples will be well known to those skilled in the art. C-V analysis was first proposed in 1962 by M Terman. The C-V characteristics are determined by applying varying bias voltages and measuring the resulting capacitance. The bias voltage generally includes a DC voltage on which an AC signal is superposed. The DC voltage is gradually varies so that the device under test operates successively in an accumulation mode and a depletion mode. C-V meters are widely commercially available. The implementation of these apparatus features and algorithms will be routine to those skilled in the art.

The phase measurement circuitry for generating the (real time) feedback control signal (dependent on the CV characteristics) can also be routine, and phase measurement techniques are also well known to those skilled in the art. The measured phase comprises the transfer function of the diode, i.e. the resistance/impedance characteristic, which for an ideal capacitor is 90 degrees. The departure from this ideal capacitance in the case of a diode has been found to be representative of the interface trap density, and in turn dictates the output wavelength and intensity characteristics.

The phase measurement frequency is preferably 1 MHz or lower, for example 500 kHz. The mapping of the measured phase to the wavelength (and optionally intensity) characteristics, based on the relationship determined from the sample analysis, can be implemented with a conventional processor.

By dominant output wavelength is meant the wavelength at which the output intensity is at is peak. However, this wavelength will not need to be absolutely precise, and can be obtained to within a desired wavelength band.

Various other modifications will be apparent to those skilled in the art.

The invention claimed is:

1. A method of determining the dominant output wavelength of an LED, comprising:
    determining an electrical characteristic of the LED which is dependent on the voltage-capacitance characteristics; and
    analysing the electrical characteristic to determine the dominant output wavelength.

2. A method as claimed in claim 1, wherein determining the electrical characteristic comprises determining the phase, and deriving the dominant output wavelength from the phase.

3. A method as claimed in claim 2, wherein deriving the dominant output wavelength from the phase comprises determining the phase difference from 90 degrees.

4. A method as claimed in claim 1, wherein determining the dominant output wavelength comprises comparing the determined electrical characteristic with sample data which has been derived by analysing the relationship between the voltage-capacitance characteristics of the sample and the dominant output wavelength for sample LED devices.

5. A method as claimed in claim 1, further comprising determining information about the output intensity characteristics from the voltage-capacitance characteristic.

6. A method of controlling an LED, comprising:
    determining the dominant output wavelength of the LED using a method comprising,
    determining an electrical characteristic of the LED which is dependent on the voltage-capacitance characteristics; and
    analysing the electrical characteristic to determine the dominant output wavelength; and
    controlling the LED in dependence on the determined dominant output wavelength.

7. A method of controlling a plurality of different coloured LEDs, comprising:
    determining the dominant output wavelength for each of the LEDs using a method comprising,
    determining an electrical characteristic of the LED which is dependent on the voltage-capacitance characteristics; and
    analysing the electrical characteristic to determine the dominant output wavelength; and
    controlling the LEDs in dependence on the determined dominant output wavelengths, thereby obtaining a desired combined colour output.

8. A display driving method, comprising controlling a plurality of different coloured LEDs using the method of claim 7, wherein the plurality of different coloured LEDs define a display pixel, and wherein the display comprises a plurality of display pixels.

9. A display driving method, comprising controlling a plurality of different coloured LEDs using the method of claim 7, wherein the plurality of different coloured LEDs define a display backlight.

10. An arrangement for determining the dominant output wavelength of an LED, comprising:
    means, including control circuitry, for determining an electrical characteristic of the LED which is dependent on the voltage-capacitance characteristics; and
    means, communicatively and electrically coupled with the control circuitry, for analysing the electrical characteristic to determine the dominant output wavelength.

11. An arrangement as claimed in claim 10, wherein the means for determining an electrical characteristic comprises means for determining the phase, and deriving the dominant output wavelength from the phase.

12. An arrangement as claimed in claim 11, wherein the means for analysing comprises means for determining the phase difference from 90 degrees.

13. An arrangement as claimed in claim 12, comprising means comparing the determined electrical characteristic with sample data which has been derived by analysing the relationship between the voltage-capacitance characteristic and the dominant output wavelength for sample LED devices.

14. An arrangement as claimed in claim 10, wherein the means for analysing is further adapted to determine information about the output intensity characteristics from the determined electrical characteristic.

15. A display device comprising:
    a plurality of LED pixels; and
    an arrangement for determining the dominant output wavelength of each LED, as claimed in claim 10.

16. A display device comprising:
    a plurality of pixels;
    a backlight comprising a plurality of LEDs; and
    an arrangement for determining the dominant output wavelength of each LED, as claimed in claim 10.

17. The apparatus of claim 10, wherein the means for determining includes circuitry configured and arranged to determine the electrical characteristic of the LED;

and the means for analyzing includes a computer processor.

18. The apparatus of claim 17, wherein the circuitry is configured for comparing the determined electrical characteristic with sample data corresponding to characteristics of the LED.

19. The apparatus of claim 17, wherein the circuitry is configured for comparing the determined electrical characteristic with sample data that characterizes dominant output wavelengths of respective sample LEDs.

* * * * *